(12) United States Patent
Lensing et al.

(10) Patent No.: US 7,822,567 B2
(45) Date of Patent: Oct. 26, 2010

(54) METHOD AND APPARATUS FOR IMPLEMENTING SCALED DEVICE TESTS

(75) Inventors: Kevin R. Lensing, Austin, TX (US); Michael G. McIntyre, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 7 days.

(21) Appl. No.: 11/771,467

(22) Filed: Jun. 29, 2007

(65) Prior Publication Data
US 2009/0006021 A1    Jan. 1, 2009

(51) Int. Cl.
*G01N 37/00* (2006.01)
*G01R 31/28* (2006.01)

(52) U.S. Cl. .............. 702/83; 324/73.1; 324/158.1; 324/765; 702/118; 714/733

(58) Field of Classification Search ............. 702/82–83, 702/118, 123, 183, 185, 125; 324/73.1, 158.1, 324/765; 714/30, 733; 716/14
See application file for complete search history.

(56) References Cited

U.S. PATENT DOCUMENTS

| 5,206,582 | A | * | 4/1993 | Ekstedt et al. | 324/73.1 |
| 5,418,452 | A | * | 5/1995 | Pyle | 324/158.1 |
| 6,728,916 | B2 | * | 4/2004 | Chen et al. | 714/733 |
| 7,112,979 | B2 | * | 9/2006 | Arabi et al. | 324/765 |

\* cited by examiner

*Primary Examiner*—John H Le
(74) *Attorney, Agent, or Firm*—Williams, Morgan & Amerson, P.C.

(57) ABSTRACT

A method includes defining a hierarchy of test routines in a test program for testing integrated circuit devices. A first device is tested at a first screening level in the hierarchy. The first device is tested at a second detailed level in the hierarchy responsive to the first device failing the testing at the first screening level.

20 Claims, 3 Drawing Sheets

300 — Define a hierarchy of test routines in a test program for testing integrated circuit devices 310 — Test a first device at a first screening level in the hierarchy 320 — Test the first device at a second detailed level in the hierarchy responsive to the first device failing the testing at the first screening level

METHOD AND APPARATUS FOR IMPLEMENTING SCALED DEVICE TESTS

CROSS-REFERENCE TO RELATED APPLICATIONS

Not applicable.

BACKGROUND OF THE INVENTION

The disclosed subject matter relates generally to manufacturing and, more particularly, to a method and apparatus for implementing scaled device tests.

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a wafer using a variety of processing tools, including photolithography steppers, etch tools, deposition tools, polishing tools, rapid thermal processing tools, implantation tools, etc. During the fabrication process various events may take place that affect the performance of the devices being fabricated. That is, variations in the fabrication process steps result in device performance variations. Factors, such as feature critical dimensions, doping levels, contact resistance, particle contamination, etc., all may potentially affect the end performance of the device.

After fabrication of the devices is complete, each wafer is subjected to preliminary functional tests, commonly referred to as final wafer electrical tests (FWET) that evaluate test structures on the wafer and SORT tests that evaluate each die. Wafers that pass these tests are then cut to singulate the individual die, which are then packed in substrates. Packed dies are then subjected to additional tests against the specification of customers' orders to determine performance characteristics such as maximum operating speed, power, caches, etc.

Exemplary tests include initial class tests (ICL) that is a preliminary test for power and speed. ICL testing is usually followed by burn-in (BI) and post burn-in (PBI) tests that test packaged die under specified temperature and/or voltage stress, and automatic test equipment (ATE) tests that test die functionality. Then, packaged die with different characteristics go through system-level tests (SLT) in which they are tested against customer requirements on specific electrical characteristics. In SLT, packaged die are tested in an actual motherboard by running system-level tests (e.g., variance test programs). After completion of the testing, the devices are fused, marked, and packed to fill customer orders. This back-end processing is commonly referred to as the test, mark, pack (TMP) process.

Typically, programs implemented for testing devices are lengthy and detailed. These test programs are typically written at the beginning of the device life cycle so that the new device may be thoroughly exercised and characterized. Generally, the test program does not change significantly once it is implemented. The length of time required to implement these tests is a throughput limiting factor in the production flow.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY OF THE INVENTION

The following presents a simplified summary of the disclosed subject matter in order to provide a basic understanding of some aspects thereof. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method implementing scaled device tests. The method includes defining a hierarchy of test routines in a test program for testing integrated circuit devices. A first device is tested at a first screening level in the hierarchy. The first device is tested at a second detailed level in the hierarchy responsive to the first device failing the testing at the first screening level.

Another aspect of the disclosed subject matter is seen in a method including defining a hierarchy of test routines in a test program for testing integrated circuit devices. The hierarchy includes a plurality of levels. Sampling rates are assigned to at least a subset of the levels. Devices are tested at individual hierarchy levels using the test program based on the sampling rates.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
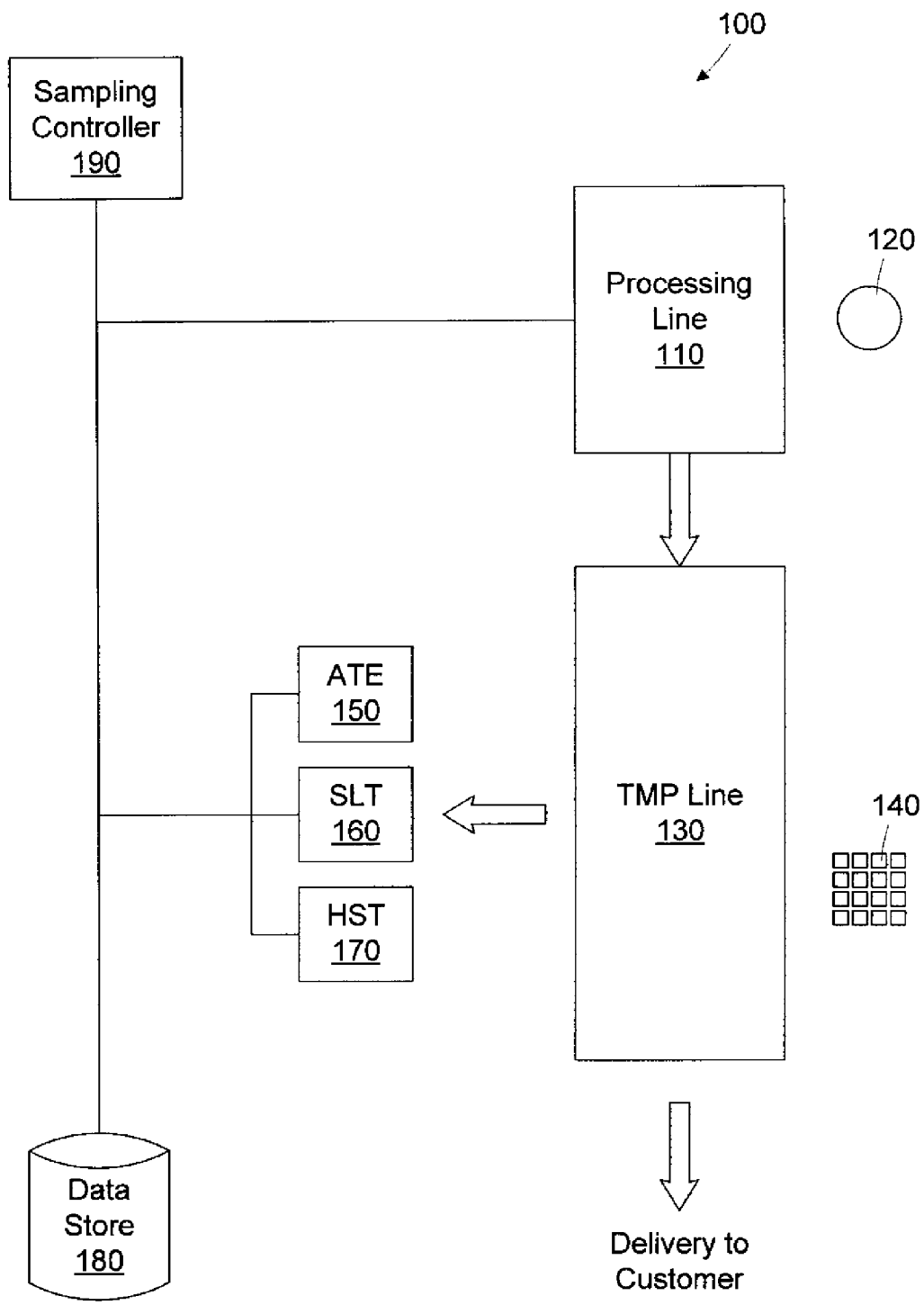
FIG. 1 is a simplified block diagram of a manufacturing system in accordance with one embodiment of the disclosed subject matter.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION OF THE INVENTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Portions of the disclosed subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "accessing" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices. Note also that the software implemented aspects of the disclosed subject matter are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The disclosed subject matter is not limited by these aspects of any given implementation.

Referring now to the drawings wherein like reference numbers correspond to similar components throughout the several views and, specifically, referring to FIG. 1, the disclosed subject matter shall be described in the context of an illustrative manufacturing system 100. The manufacturing system 100 includes a processing line 110 for fabricating wafers 120, a test, mark, pack (TMP) line 130 for processing devices 140, an automated test equipment (ATE) tester 150, a system lever tester (ST) 160, a hybrid system tester (HST) 170, a data store 180, and a sampling controller 190.

In the illustrated embodiment, wafers 120 are processed by the processing line 110 to fabricate die thereon. The processing line 110 may include a variety of process tools and/or metrology tools, which may be used to process and/or examine the wafers to fabricate the semiconductor devices. For example, the process tools may include photolithography steppers, etch tools, deposition tools, polishing tools, rapid thermal anneal tools, ion implantation tools, and the like. The process metrology tools may include thickness measurement tools, scatterometers, ellipsometers, scanning electron microscopes, and the like. Techniques for processing the wafers 120 are well known to persons of ordinary skill in the art and therefore will not be discussed in detail herein for clarity and to avoid obscuring the disclosed subject matter. Although a single wafer 120 is pictured in FIG. 1, it is to be understood that the wafer 120 is representative of a single wafer as well as a group of wafers, e.g. all or a portion of a wafer lot that may be processed in the processing line 110.

After the wafers 120 have been processed in the processing line 110 to fabricate the die, certain metrology tools, such as sort or final wafer electrical test (FWET) tools may be employed to collect electrical performance data while the wafer is still uncut. Sort metrology employs a series of probes to electrically contact pads on the completed die to perform electrical and functional tests. For example, a sort metrology tool may measure voltages and/or currents between various nodes and circuits that are formed on the wafer 120. Exemplary sort parameters measured include, but are not limited to, clock search parameters, diode characteristics, scan logic voltage, static $I_{DD}$, minimum $V_{DD}$, power supply open short characteristics, and ring oscillator frequency, etc. The particular sort parameters selected may vary depending on the application and the nature of the device formed on the die. Final wafer electrical testing (FWET) entails parametric testing of discrete structures like transistors, capacitors, resistors, interconnects and relatively small and simple circuits, such as ring oscillators. It is intended to provide a quick indication as to whether or not the wafer is within basic manufacturing specification limits. Wafers that exceed these limits are typically discarded so as to not waste subsequent time or resources on them.

Based on FWET and sort data, the die may be assigned preliminary market segment designators or bin assignments. These classifications indicate the type of application the die is likely to be capable of serving. Exemplary market segments include server, mobile, and desktop. Generally, devices with low power requirements are better suited for mobile applications, while those with higher power requirements are better suited for server or desktop applications. Differentiations between servers and desktops may be made on the basis of maximum frequency and/or process conditions. For example, devices which had some process faults during fabrication in the processing line 110 may be designated as being ineligible for server applications.

After the die on the wafer 120 have completed preliminary testing, the wafers 120 are cut to singulate the die. Each die is then each mounted to a package, resulting in the devices 140. The test units 150, 160, 170 then subject the devices 140 to various testing programs to grade the devices and verify full functionality. Although only single testers 150, 160, 170 are illustrated, an actual implementation will involve multiple testers 150, 160, 170 of each type. In addition, a particular tester 150, 160, 170 may test multiple devices 140 in parallel.

Typically, ATE testers 150 are designed for high throughput, high accuracy testing. For example, an ATE tester 150 generally can run tests at different voltage levels with precise voltage control. The system level tester 160 is configured to test devices in an actual system environment, such as by booting an operating system. System level testers 160 do not exhibit the speed characteristics or the voltage control characteristics of ATE testers 150. Hybrid system testers 170 are configured to perform burn-in tests and system level tests.

The data store 180 houses information related to the testing of the devices 140 over the plurality of test program runs, or insertions. In the illustrated example, an ATE tester 150 performs initial testing of the devices 140, referred to as ICL testing above. The ATE tester 150 does not employ a fixed test program for performing the test. One goal of ICL testing is to verify the FWET and sort results with respect to the bin assignment. The ATE tester 150 implements a tiered approach to testing the devices 140. Generally, device sampling may be implemented that involves performing full tests on only a sample of the devices 140. Other devices 140 may receive screening tests to determine of they are likely to meet the acceptance criteria that would have been applied to a full test. Over the life cycle of a particular device type, the sampling rates may be adjusted. Also, the sampling rate may be increased if shifts are identified. The sampling controller 190 may interface with the ATE tester 150 to provide sampling rate information. For example, the sampling controller 190 may analyze the failure results from previous tests to determine process stability and the relative maturity of the technology for determining sampling rates. Although the following illustration describes an ATE testing protocol, the technique described herein may also be applied to different testers, such as the system level tester 160 or the hybrid system tester 170.

Figure 2:
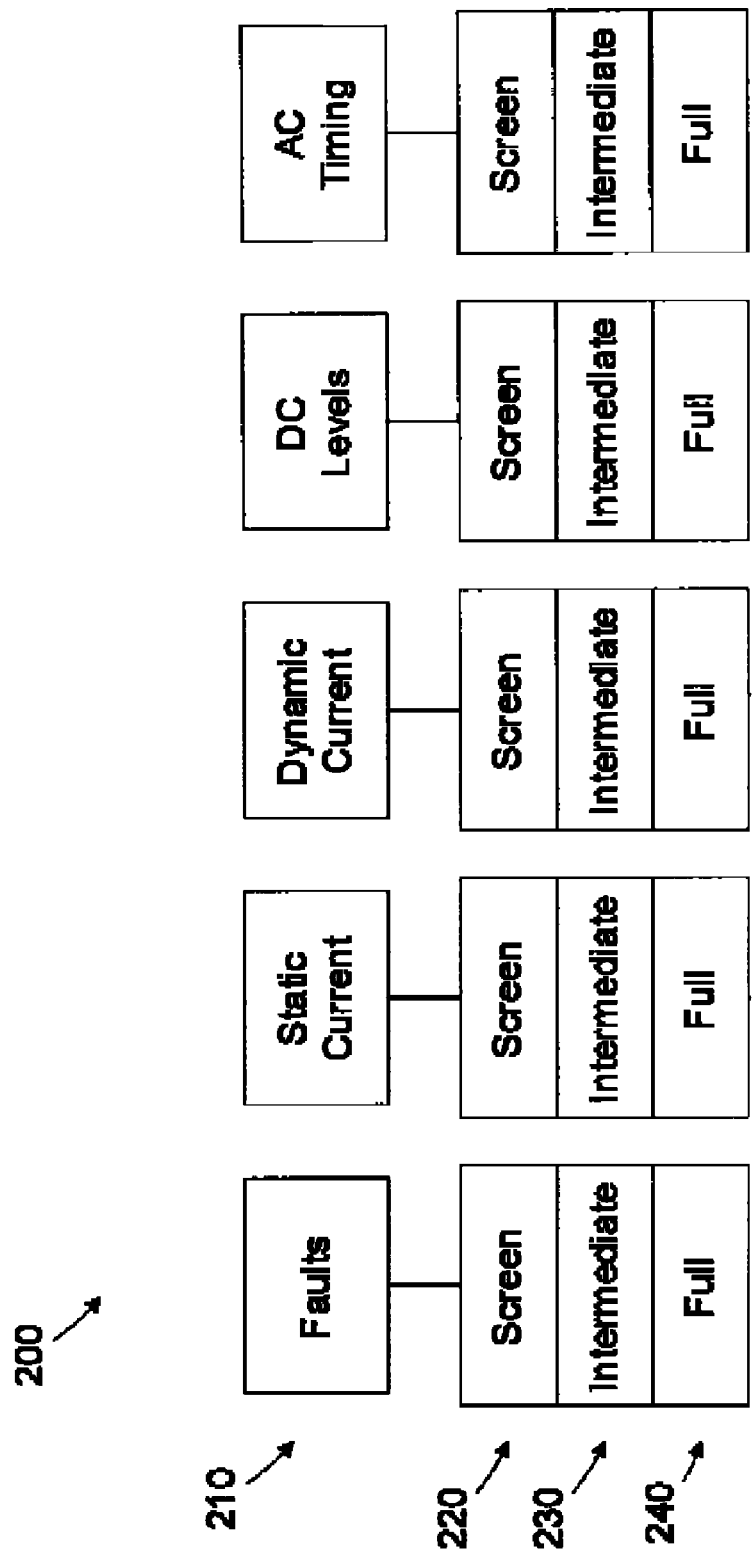
FIG. 2 is a simplified diagram of a test hierarchy.

Referring now to FIG. 2, in implementing the device sampling approach, a hierarchy 200 is employed. In the illustrated embodiment, the hierarchy includes categories 210 for Faults (e.g., open shorts or power supply shorts), Static Current (static $I_{DD}$), Dynamic Current (dynamic $I_{DD}$), DC levels (min $V_{DD}$), AC Timing, etc. The particular number of categories used may vary depending on the nature of the devices 140, and the selection illustrated in FIG. 2 is intended to be illustrative rather than limiting or exhaustive. Within each category 210, different test levels 220, 230, 240 may be defined. For example, the level 220 may be a screening level, the level 230 may be an intermediate level, and the level 240 may represent a detailed test level (i.e., full test). The ATE tester 150 may implement different sampling plans for each category 210, depending on the particular implementation. The hierarchy 200 may be maintained by the ATE tester 150 or the sampling controller 190 depending on the particular implementation.

The particular types of tests performed and the segregation into levels may vary. Those of ordinary skill in the art are familiar with the various test protocols and techniques for separating the tests into different levels. As a typical test program may specify hundreds of different tests, the specific break downs of the levels are not detailed herein for simplicity and to avoid obscuring present subject matter.

In one embodiment, a multivariate model, such as a principal component analysis (PCA) model may be used by the sampling controller 190 to identify the parameter or parameters that most greatly affect the accuracy of the tester characterization. Other types of multivariate statistics-based analysis techniques that consider a plurality of parameters may be used. For example, one alternative modeling technique includes a k-Nearest Neighbor (KNN) technique. Based on the model the sampling controller 190 may determine the levels applied to the various categories 210. For example, if static current is determined to be an important parameter, relative to the other categories 210, a more detailed test level 240 may be specified. Similarly, for those categories 210 that are relatively less important contributors, a lesser test level 220, 230 may be selected. The particular contributors may vary over the life cycle of the device 140. As the technology matures, the characterization of the devices 140 is generally more complete. The sampling controller 190 may adjust the testing protocols accordingly.

If a particular device passes the screening level test 220, the ATE tester 150 may skip the more detailed levels 230, 240 for that device. If the device does not pass the screening level test 220, the next level 230 may be executed to better characterize the device 140. The screening threshold for the screening level 220 is typically set well above that of an actual device failure threshold. The screening level 220 seeks to provide assurance that the device is well within the expected ranges for typical devices. Based on past experience with the devices 140 of a similar type, it is likely that the device 140 passing the screening test 210 will have similar characteristics to those previously tested devices. In other words, the device 140 is likely to be placed in the same performance bin as the previously tested devices, and the preliminary binning conducted using FWET and sort data (i.e., market segment assignment) is likely to be accurate. If the device 140 does not appear to be in the "well characterized" group, additional testing is warranted to determine the proper bin designation. The device model described above may be used to provide information for determining the screening thresholds for well characterized devices using a performance distribution or other statistical techniques.

In some embodiments, the sampling controller 190 and/or ATE tester 150 may set different sampling levels, either on the device level, the category level 210, or both. In a first example, the sampling controller 190 specifies sample rates on the device level. For example, a certain percentage of devices 140 may receive a full detailed test in all categories 210 to ensure that a shift has not occurred. The percentage of devices 140 that receive a full test may be determined by the sampling controller 190 based on the results of previous tests. The sampling controller 190 or ATE tester 150 may maintain device count statistics to implement the sampling plan specified by the sampling controller 190. For instance, 20% of the devices 140 may receive full tests 240 across all categories 210, and 80% may receive only screening tests 220 across all categories. Only those devices failing a screening test 220 may receive more detailed testing. In one embodiment, if a device fails any of the screening tests 220, a full test 240 may be performed on all categories 210. In another embodiment, more detailed tests may only be performed for the categories 210 for which the device 140 failed the associated screening tests 220. If the sampling controller 190 identifies an increasing trend in screening failures, the percentage of devices that receive full tests may be increased.

In a second illustrative example, individual sampling rates may be specified by the sampling controller 190 for each category 210. If a particular category 210 is relatively more deterministic for evaluating the bin classification, a higher percentage of devices 140, or even all of the devices 140, may receive a detailed level test 240 for that category 210 and only screening tests 220 for the other categories 210. The sampling rates may be adjusted by the sampling controller 190 based on historical results. The sampling controller 190 or the ATE tester 150 may maintain device counts for each category to determine the sampling rates and levels for the different categories 210. Again, if a particular device 140 fails a screening test 220, more detailed testing is warranted for that device 140, but the overall sampling rate may not change. If the sampling controller 190 identifies an increasing trend in screening failures, the sampling rates may be adjusted.

Figure 3:
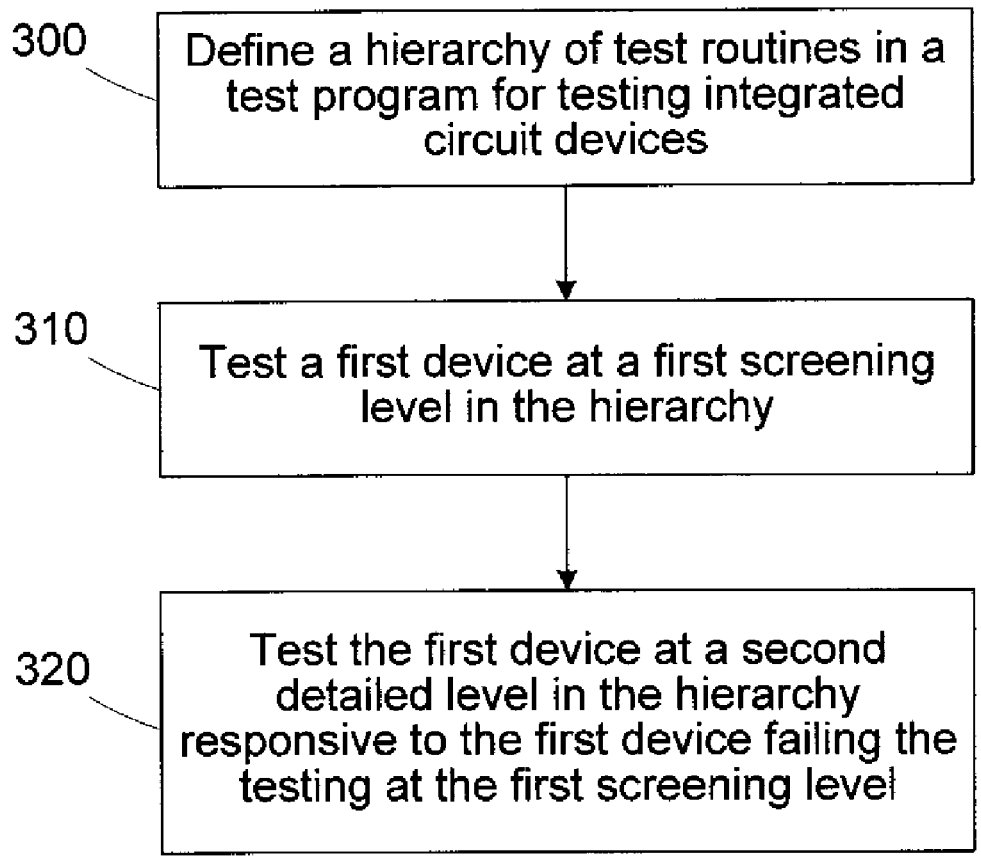
FIG. 3 is a simplified flow diagram of a method for implementing scaled device tests in accordance with another illustrative embodiment of the disclosed subject matter.

Turning now to FIG. 3, a simplified flow diagram for testing devices is provided. In method block 300, a hierarchy of test routines is defined in a test program for testing devices. In method block 310, a first device is tested at a first screening level in the hierarchy. In method block 320, the first device is tested at a second detailed level in the hierarchy responsive to the first device failing the testing at the first screening level.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:
    defining a hierarchy of test routines in a test program for testing integrated circuit devices;
    testing a first device using a device tester at a first screening level in the hierarchy; and
    testing the first device at a second detailed level in the hierarchy responsive to the first device failing the testing at the first screening level, wherein defining the hierarchy further comprises:
        defining a plurality of categories associated with device performance characteristics;
        defining a plurality of hierarchy levels associated with each of the categories; and
        assigning test routines to the plurality of hierarchy levels.

2. The method of claim 1, further comprising:
    testing a second device at the first screening level in the hierarchy; and
    terminating the test program for the second device responsive to the second device passing the testing at the first screening level.

3. The method of claim 1, wherein the hierarchy includes a plurality of levels and the method further comprises:
    determining sampling rates for at least a subset of the levels in the hierarchy; and
    testing a plurality of devices in accordance with the hierarchy based on the sampling rates.

4. The method of claim 3, further comprising adjusting the sampling rates based on observed test routine failures.

5. The method of claim 1, further comprising:
    determining sampling rates for at least a subset of the hierarchy levels; and
    testing devices in accordance with the hierarchy based on the sampling rates.

6. The method of claim 5, further comprising employing a multivariate model to determine the sampling rates.

7. A method, comprising:
    defining a hierarchy of test routines in a test program for testing integrated circuit devices, the hierarchy including a plurality of levels;
    assigning sampling rates using a sampling controller to at least a subset of the levels, each of said sampling rates indicating a percentage of the integrated circuit devices entering an associated level to be tested at the associated level; and
    testing devices at individual hierarchy levels using the test program based on the sampling rates.

8. The method of claim 7, further comprising:
    testing a first device at a first level of the hierarchy based on the sampling rates; and
    testing the first device at a second level in the hierarchy responsive to the first device failing the testing at the first level.

9. The method of claim 8, further comprising:
    testing a second device at the first level of the hierarchy based on the sampling rates; and
    terminating the test program for the second device responsive to the second device passing the testing at the first level.

10. The method of claim 7, further comprising adjusting the sampling rates based on observed test routine failures associated with the plurality of levels.

11. The method of claim 7, wherein defining the hierarchy further comprises:
    defining a plurality of categories associated with device performance characteristics;
    defining a plurality of hierarchy levels associated with each of the categories; and
    assigning test routines to the plurality of hierarchy levels.

12. The method of claim 7, further comprising employing a multivariate model of measured device performance characteristics to determine the sampling rates.

13. The method of claim 7, wherein a first level in the hierarchy comprises is associated with a screening test routine and a second level in the hierarchy is associated with a detailed test routine.

14. A system, comprising:
    a device tester operable to test integrated circuit devices using a test program including a hierarchy of test routines, wherein the hierarchy includes a plurality of levels and at least a subset of the levels have associated sampling rates; and
    a sampling controller operable to assign the sampling rates to the subset of the levels, each of said sampling rates indicating a percentage of the integrated circuit devices entering an associated level to be tested at the associated level.

15. The system of claim 14, wherein the device tester is further operable to test a first device at a first level of the hierarchy based on the sampling rates and test the first device at a second level in the hierarchy responsive to the first device failing the testing at the first level.

16. The system of claim 15, wherein the device tester is further operable to test a second device at the first level of the hierarchy based on the sampling rates and terminate the test program responsive to the second device passing the testing at the first level.

17. The system of claim 14, wherein the sampling controller is operable to adjust the sampling rates based on observed test routine failures associated with the plurality of levels.

18. The system of claim 14, wherein the hierarchy further comprises a plurality of categories associated with device performance characteristics and a plurality of hierarchy levels associated with each of the categories.

19. The system of claim 14, wherein the sampling controller is operable to employ a multivariate model of measured device performance characteristics to determine the sampling rates.

20. The system of claim 14, wherein a first level in the hierarchy comprises is associated with a screening test routine and a second level in the hierarchy is associated with a detailed test routine.

* * * * *